United States Patent [19]
Levy et al.

[11] Patent Number: 6,103,592
[45] Date of Patent: *Aug. 15, 2000

[54] MANUFACTURING SELF-ALIGNED POLYSILICON FET DEVICES ISOLATED WITH MASKLESS SHALLOW TRENCH ISOLATION AND GATE CONDUCTOR FILL TECHNOLOGY WITH ACTIVE DEVICES AND DUMMY DOPED REGIONS FORMED IN MESAS

[75] Inventors: Max Gerald Levy; Bernhard Fiegl, both of Wappingers Falls, N.Y.; Walter Glashauser, Diesenhofen, Germany; Frank Prein, Wappingers Falls, N.Y.

[73] Assignees: International Business Machines Corp., Armonk, N.Y.; Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/850,093

[22] Filed: May 1, 1997

[51] Int. Cl.⁷ .................................................. H01L 21/76
[52] U.S. Cl. ..................... 438/424; 438/692; 438/699; 438/734
[58] Field of Search .................... 438/424, 691, 438/692, 699, 734, 759, 959, FOR 111, FOR 227

[56] References Cited

U.S. PATENT DOCUMENTS

| | | |
|---|---|---|
| 4,962,064 | 10/1990 | Haskell et al. . |
| 5,173,439 | 12/1992 | Dash et al. ................................ 437/67 |
| 5,252,517 | 10/1993 | Blalock et al. .......................... 437/195 |
| 5,358,884 | 10/1994 | Violette .................................... 437/341 |
| 5,411,913 | 5/1995 | Bashir et al. ............................. 437/67 |
| 5,492,858 | 2/1996 | Bose et al. ................................ 437/67 |
| 5,494,857 | 2/1996 | Cooperman et al. .................... 437/228 |
| 5,504,033 | 4/1996 | Bajor et al. ............................... 437/67 |
| 5,663,107 | 9/1997 | Peschke . |
| 5,721,172 | 2/1998 | Jang et al. . |

OTHER PUBLICATIONS

J.–Y. Cheng, T.F. Lei, T.S. Chao, D.L.W.Yen, B.J. Jin, and C. J. Lin "A Novel Planarization of Oxide–Filled Shallow–Trench Isolation" J. Electrochem. Soc., vol. 144, No. 1, (Jan., 1997) pp. 315–320.

*Primary Examiner*—George Fourson
*Attorney, Agent, or Firm*—H. D. Schnurmann; Graham S. Jones, II

[57] ABSTRACT

FET devices are manufactured using STI on a semiconductor substrate coated with a pad from which are formed raised active silicon device areas and dummy active silicon mesas capped with pad structures on the doped silicon substrate and pad structure. A conformal blanket silicon oxide layer is deposited on the device with conformal projections above the mesas. Then a polysilicon film on the blanket silicon oxide layer is deposited with conformal projections above the mesas. The polysilicon film projections are removed in a CMP polishing step which continues until the silicon oxide layer is exposed over the pad structures. Selective RIE partial etching of the conformal silicon oxide layer over the mesas is next, followed in turn by CMP planarization of the conformal blanket silicon oxide layer which converts the silicon oxide layer into a planar silicon oxide layer, using the pad silicon nitride as an etch stop.

16 Claims, 10 Drawing Sheets

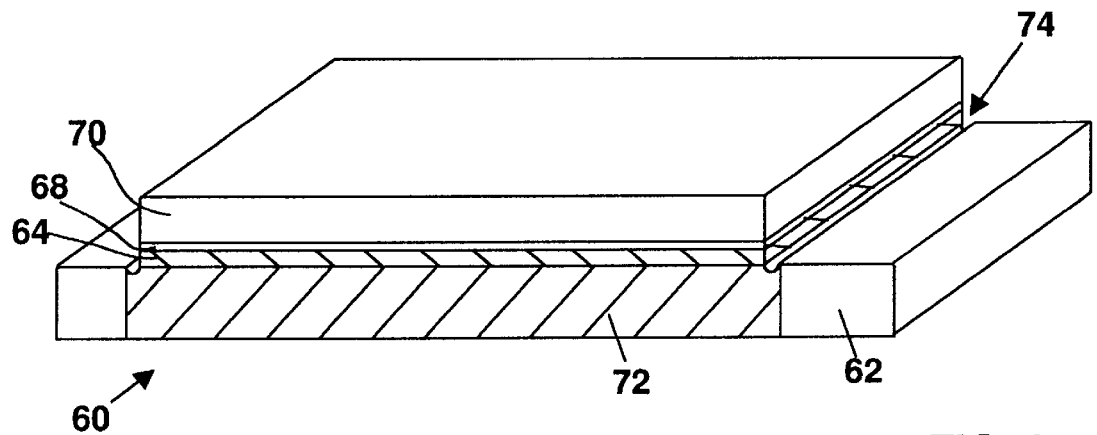
PRIOR ART  FIG. 3
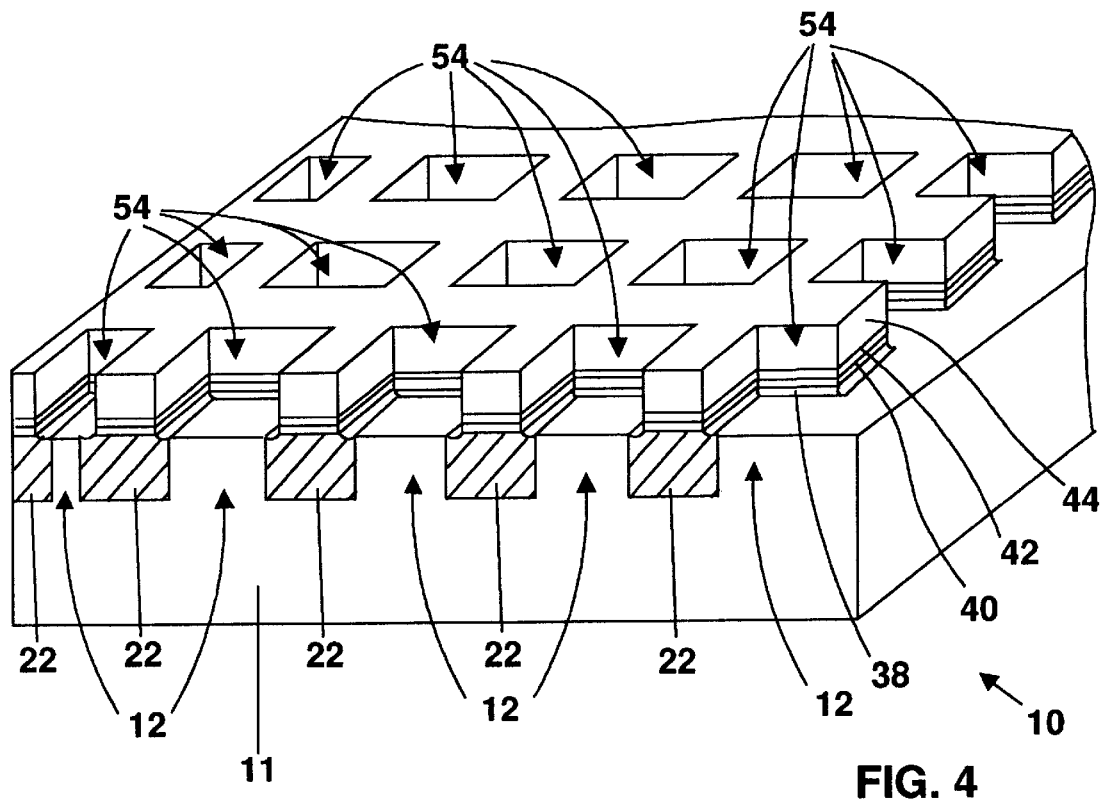
FIG. 4

MANUFACTURING SELF-ALIGNED POLYSILICON FET DEVICES ISOLATED WITH MASKLESS SHALLOW TRENCH ISOLATION AND GATE CONDUCTOR FILL TECHNOLOGY WITH ACTIVE DEVICES AND DUMMY DOPED REGIONS FORMED IN MESAS

BACKGROUND OF THE INVENTION

1. Field of the Invention

This invention relates to semiconductor devices and more particularly to shallow trench isolation in self-aligned FET devices.

2. Description of Related Art

Conventional STI (Shallow Trench Isolation) planarization methods require a planarization mask, extensive measurements, and wafer-to-wafer process customization.

Maskless STI Planarization using Self-Aligned Polysilicon process allows STI to be planarized without a planarization mask, with minimal measurements and no need for wafer to wafer customization and can be designed to be completely ground rule compatible with a gate conductor stack Fill technology.

U.S. Pat. No. 5,173,439 of Dash et al. for "Forming Wide Dielectric-Filled Isolation Trenches In Semi-conductors" shows isolation trenches formed in pad silicon nitride/Si, followed by a silicon oxide layer, followed by a polysilicon layer, followed by Chemical Mechanical Polishing (CMP); followed by silicon oxide RIE (Reactive Ion Etching); followed by CMP down to a pad silicon nitride layer.

U.S. Pat. No. 5,504,033 of Bajor et al. for "Method for Forming Recessed Oxide Isolation Containing Deep And Shallow Trenches" describes in a fifth embodiment, after isolation trenches are dug into silicon nitride over silicon oxide over silicon, the trenches along with horizontal surfaces are first layered with silicon oxide, then sequentially a polysilicon layer; is followed by CMP. This reference appears not to address selective RIE partial silicon oxide etch over pad areas.

U.S. Pat. No. 5,411,913 of Bashir et al. for "Simple Planarized Trench Isolation and Field Oxide Formation using Poly-silicon" where after trenches are dug into pad silicon oxide/silicon nitride and into silicon; a layer of silicon oxide is deposited, followed by a layer of polysilicon, followed by RIE etch back to planarize. This reference appears not to address CMP polishing down to the silicon oxide layer and selective RIE partial silicon oxide etching over pad areas.

U.S. Pat. No. 5,492,858 of Bose et al. for "Shallow Trench Isolation Process Method for High Aspect Ratio Trenches" in which, after isolation trenches are dug through the pad silicon oxide/silicon nitride into silicon, a layer of silicon oxide is deposited and CMP etched back to silicon nitride to provide a planar surface for "active mesa sites." Bose et al. does not address deposition of polysilicon on a silicon oxide layer; CMP polishing down to the silicon oxide layer; and selective RIE partial silicon oxide etching over pad areas.

U.S. Pat. No. 5,494,857 of Cooperman et al. for "Chemical Mechanical Planarization of Shallow Trenches in Semiconductor Substrates" where, after trenches are dug in through pad silicon nitride/silicon oxide, a first silicon oxide layer is deposited, followed by a first silicon etch stop layer, followed by a second silicon oxide layer; followed by a CMP down to pad silicon nitride.

U.S. Pat. No. 5,252,517 of Blalock et al. for "Method Of Conductor Isolation From A Conductive Contact Plug", where, after transistors are completed, a "planarizing insulator layer" is deposited and contact vias are etched down to diffusion areas and filled with polysilicon.

U.S. Pat. No. 5,358,884 of Violette for "Dual Purpose Contact Collector Contact and Isolation Scheme for Advanced BICMOS Processes" shows trenches are dug through silicon nitride into silicon. Silicon oxide is deposited upon the silicon nitride, and CMP is done down to silicon nitride to create a "plurality of mesas."

FIG. 3 shows an isolation region of a prior art MOSFET device 60 with a doped silicon semiconductor substrate 62 on which an STI region 72 has been formed. Above the STI region is formed a gate conductor stack 74 of fill layers comprising a polysilicon layer 64, a silicide layer 68, and a silicon nitride gate insulator layer 70.

See J.-Y. Cheng, T. F. Lei, T. S. Chao, D. L. W. Yen, B. J. Jin, and C. J. Lin "A Novel Planarization of Oxide-Filled Shallow-Trench Isolation" J. Electrochem. Soc., Vol. 144, No.1, (January, 1997) pp. 315–320.

SUMMARY OF THE INVENTION

Maskless STI (MSTI) Planarization for gate conductor Fill Technology is accomplished by designing the AA (active area) mask with dummy active silicon mesas within the holes of gate conductor punch-holes. These dummy active silicon mesas are designed with the same ground rules as the rest of the chip.

Dash et al. discusses STI planarization using polysilicon but differs from the present invention in several ways with respect to the level of the silicon oxide fill and the level of the polysilicon. The silicon oxide RIE used after polysilicon CMP does not include the required break-thru step and stops on the silicon nitride instead of in the silicon oxide. Both the break-thru step and having the RIE stop in the silicon oxide were found to be essential in creating a manufacturable process.

None of the patents discussed above describes the active area (AA) fill concept.

In accordance with this invention, a method is provided for manufacture of a semiconductor FET device employing a Shallow Trench Isolation (STI) comprising the following steps. Provide a doped silicon semiconductor substrate coated with a pad structure on the surface thereof. Form raised active silicon device areas and dummy active silicon mesas capped with pad structures from the doped silicon semiconductor substrate and the pad structure. Then deposit a conformal blanket silicon oxide layer on the device with conformal projections above the mesas. Deposit a conformal blanket polysilicon layer on the blanket silicon oxide layer with additional conformal projections above the mesas. Perform chemical mechanical polishing of the blanket polysilicon layer to remove the additional conformal projections until the silicon oxide layer is exposed over the pad structures. Then follows selective RIE partial etching of the conformal silicon oxide layer over the mesas, followed in turn by chemical mechanical polishing of the conformal blanket silicon oxide layer using pad silicon nitride as an etch stop and converting the silicon oxide layer into a planar silicon oxide layer.

Preferably, the pad structures are composed of silicon nitride; or the pad structures are composed of a lower layer of silicon oxide capped with an upper layer of silicon nitride.

It is also preferred that after the second chemical mechanical polishing in step one strips away the pad structures from the device and then forms gate oxide layers above the surfaces of the substrate exposed by stripping away the pad structures.

In addition, after formation of the gate oxide layer P-wells and N-wells are formed in the substrate beneath the gate oxide layer and the silicon oxide layer.

Following formation of the wells there is a step of blanket deposition of a gate conductor layer composed of a polysilicon sublayer and a silicide sublayer upon the device followed by blanket deposition of a dielectric layer, followed by patterning and etching of windows down to active device areas and dummy areas in the substrate followed by the step of formation of FET devices and dummy devices by ion implantation of a dose of source/drain dopant ions into the active device areas and the dummy areas in the P-wells and the N-wells.

In accordance with another aspect of this invention, a Shallow Trench Isolation (STI) semiconductor FET device comprises a doped silicon semiconductor substrate with raised active silicon device areas and dummy active silicon mesas capped with a gate oxide layer and the substrate being coated with a planarized silicon oxide layer elsewhere. There are P-wells and N-wells formed in the substrate beneath the gate oxide layers and the silicon oxide layer, and a gate conductor layer and a dielectric layer formed over the gate oxide layers and the silicon oxide layer patterned into active devices, and dummy devices.

In accordance with another aspect of this invention, a Shallow Trench Isolation (STI) semiconductor FET device comprises a doped silicon semiconductor substrate with raised active silicon device areas and dummy active silicon mesas capped with a gate oxide layer and the substrate being coated with a planarized silicon oxide layer elsewhere, a gate conductor layer and a dielectric layer formed over the gate oxide layers, and polysilicon and dielectric layers being formed above the silicon oxide layer which are then patterned into dummy devices surrounding the mesas providing a pattern of punch hole vias.

Preferably, the pad structure is stripped from the device and a gate oxide layer is formed above the surface of the substrate exposed as the pad structure is stripped away.

Preferably, FET devices with gate structure are formed on the surface of the device with gate conductor structures and dummy structures formed on the surface of the planar silicon oxide layer. "Gate Conductor (GC) stack Filli" over trenches, and etch of the fill to produce vias for vertical contacts to diffusion areas on active sites.

BRIEF DESCRIPTION OF THE DRAWINGS

The foregoing and other aspects and advantages of this invention are explained and described below with reference to the accompanying drawings, in which:

FIG. 3 shows an isolation region of a prior art MOSFET device.

FIG. 4 shows a perspective view of the device in accordance with this invention with a dummy area in which the vias reach down into dummy regions where no active devices have been formed. The structure is otherwise the same as the device described in FIGS. 1A–1O.

DESCRIPTION OF THE PREFERRED EMBODIMENT

Figure 1A:
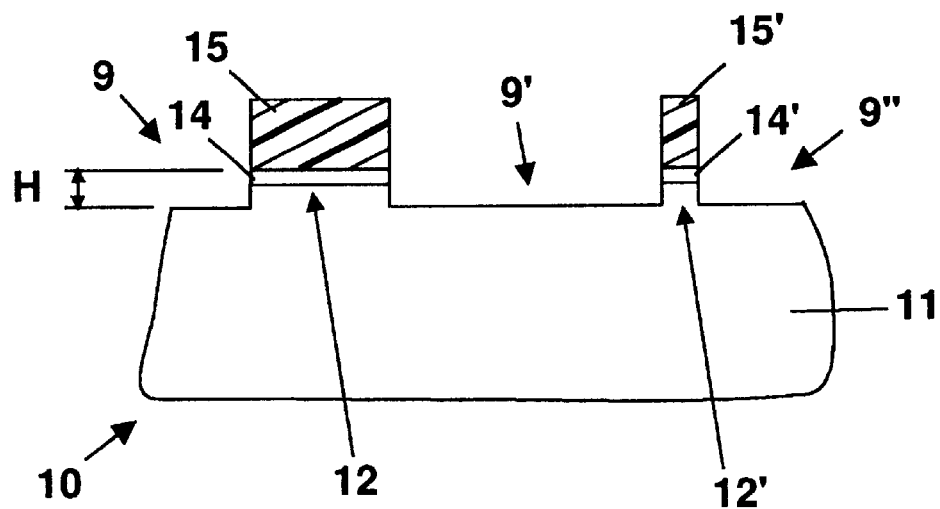
FIGS. 1A–1O illustrate a process of manufacturing a Shallow Trench Isolation (STI) device in accordance with this invention.
Figure 1B:
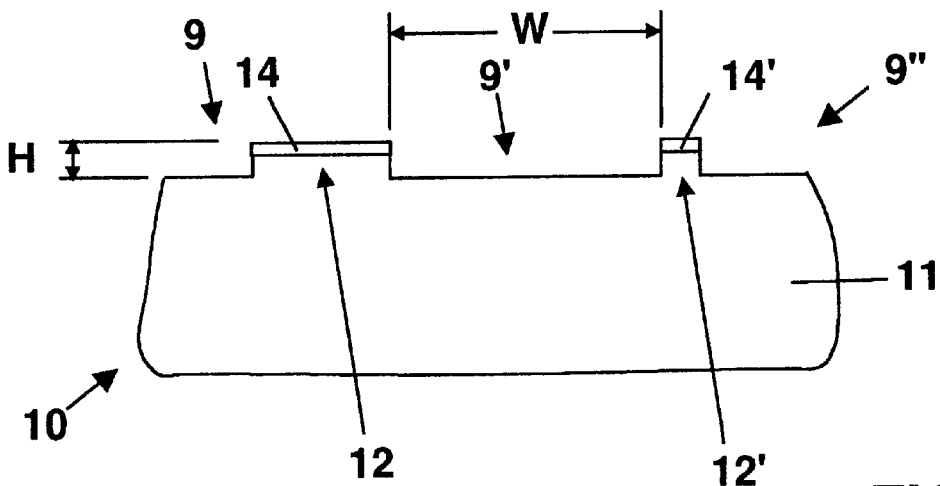
Figure 1C:
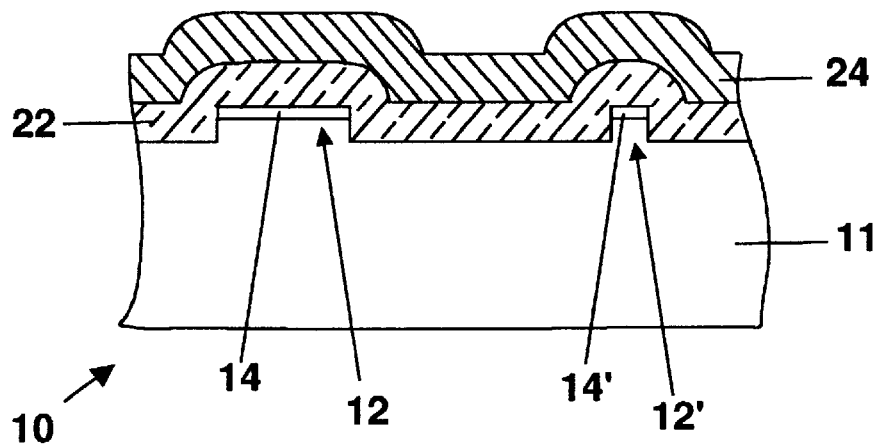
Figure 1D:
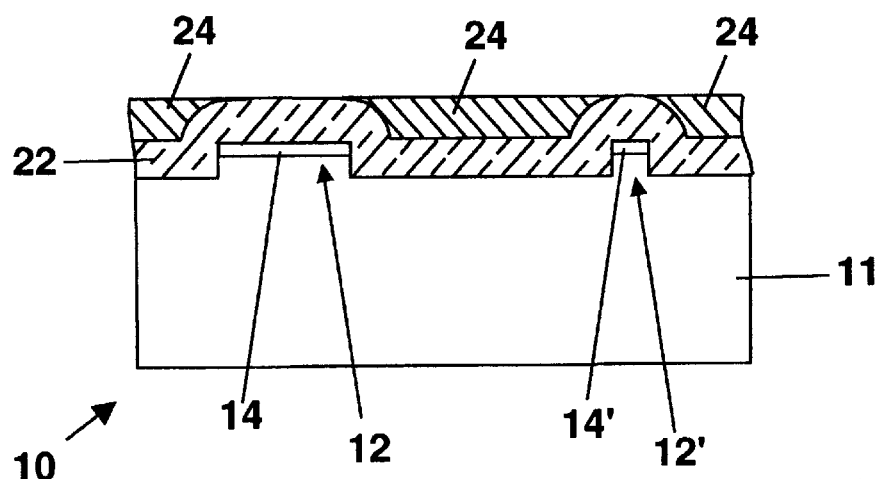
Figure 1E:
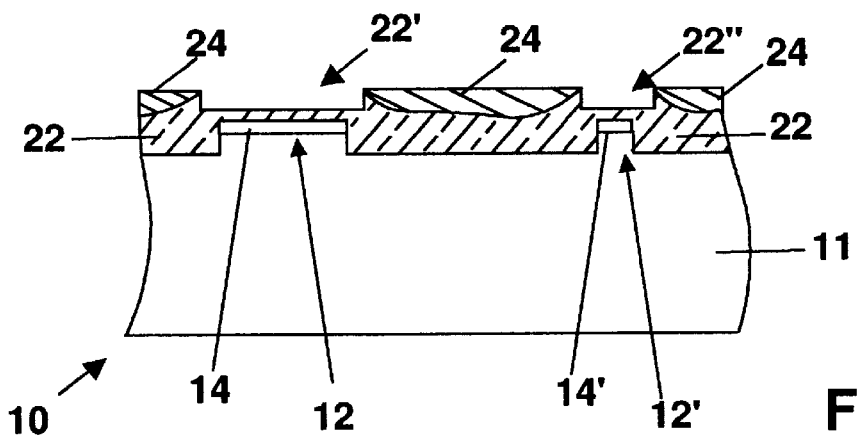
Figure 1F:
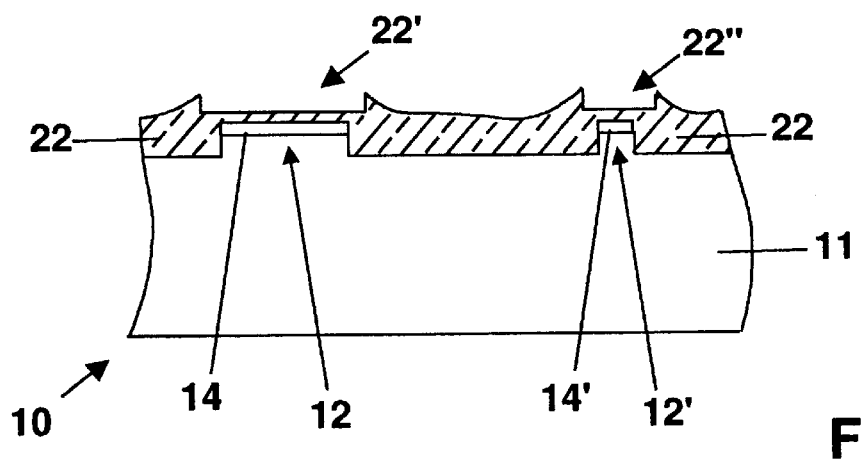
Figure 1G:
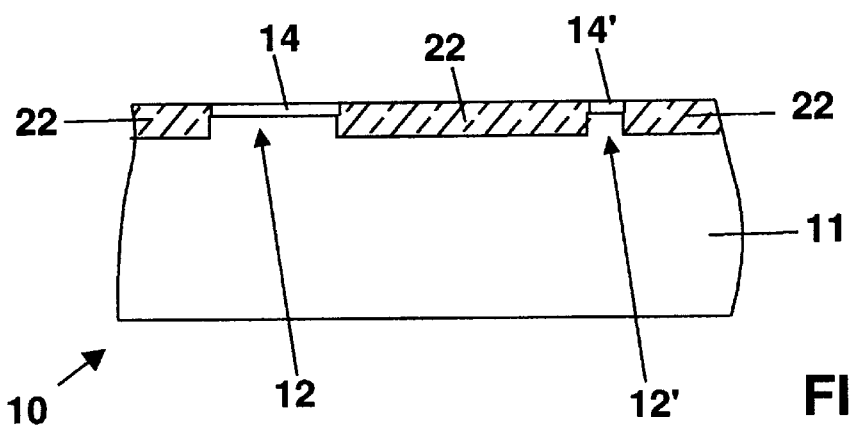
Figure 1H:
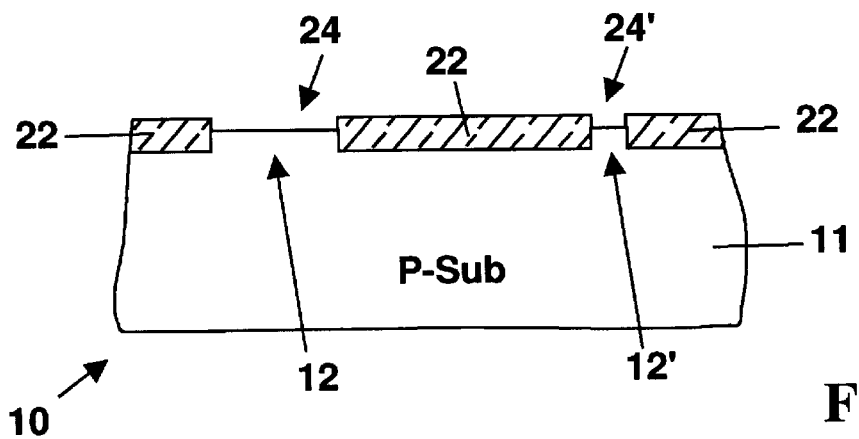
Figure 1I:
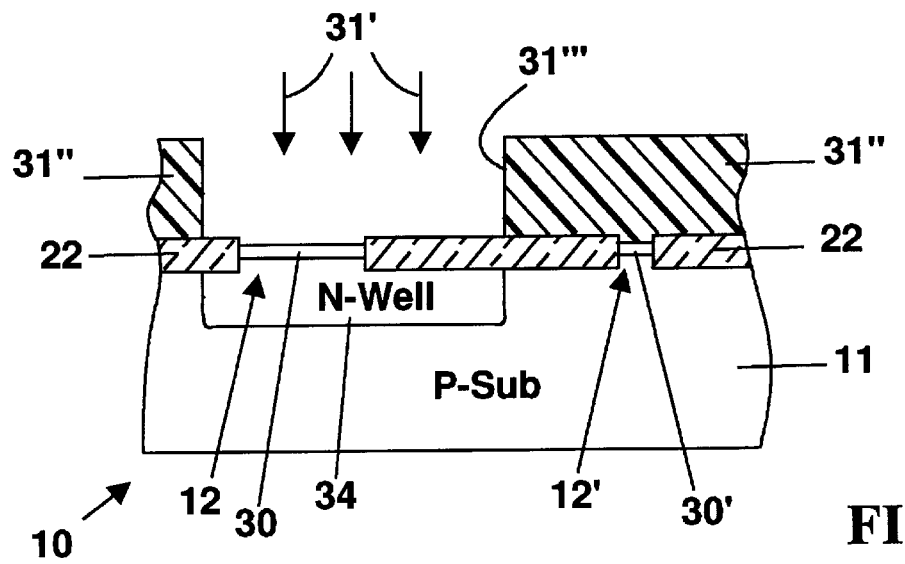
Figure 1J:
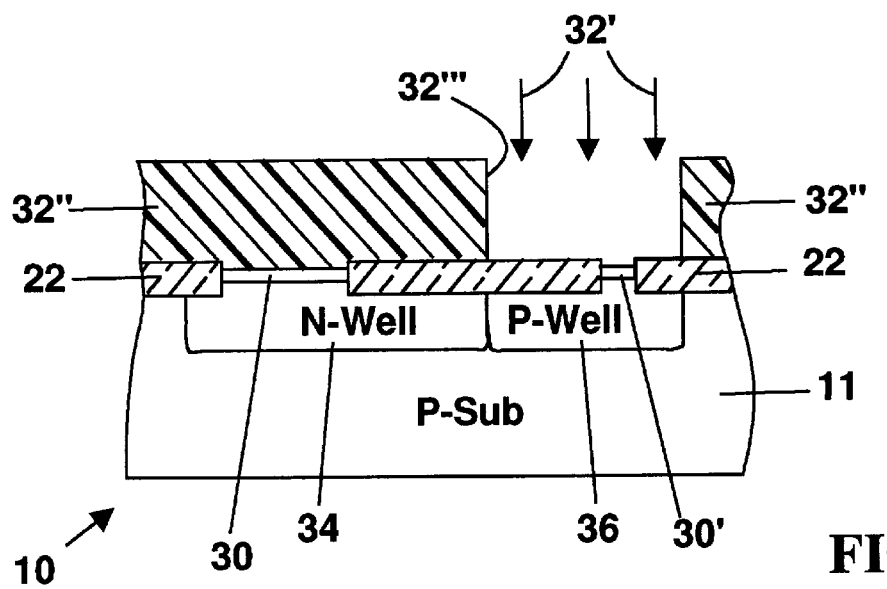
Figure 1K:
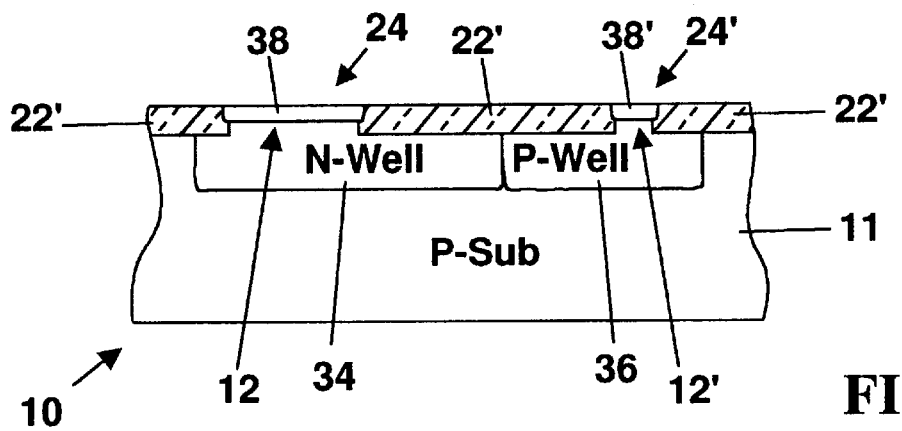
Figure 1L:
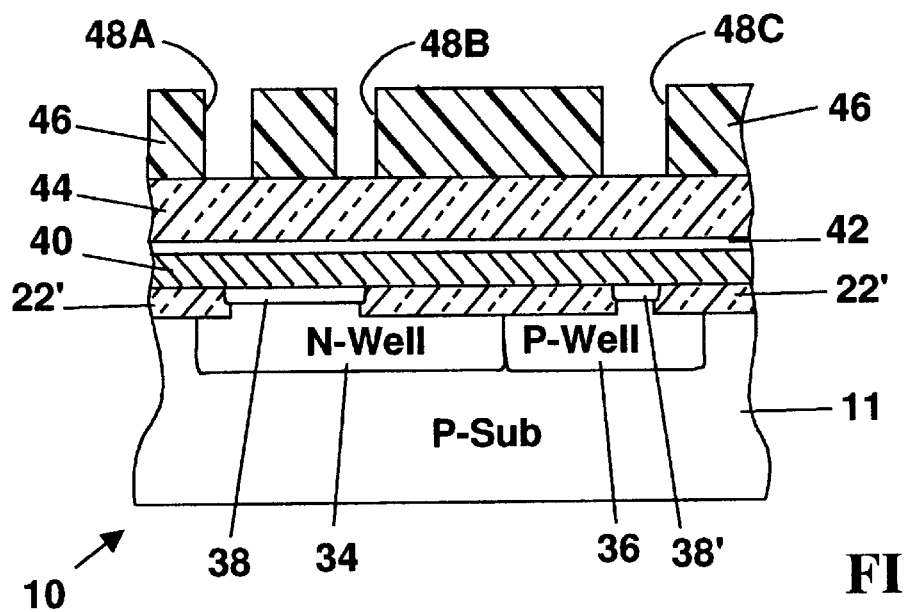
Figure 1M:
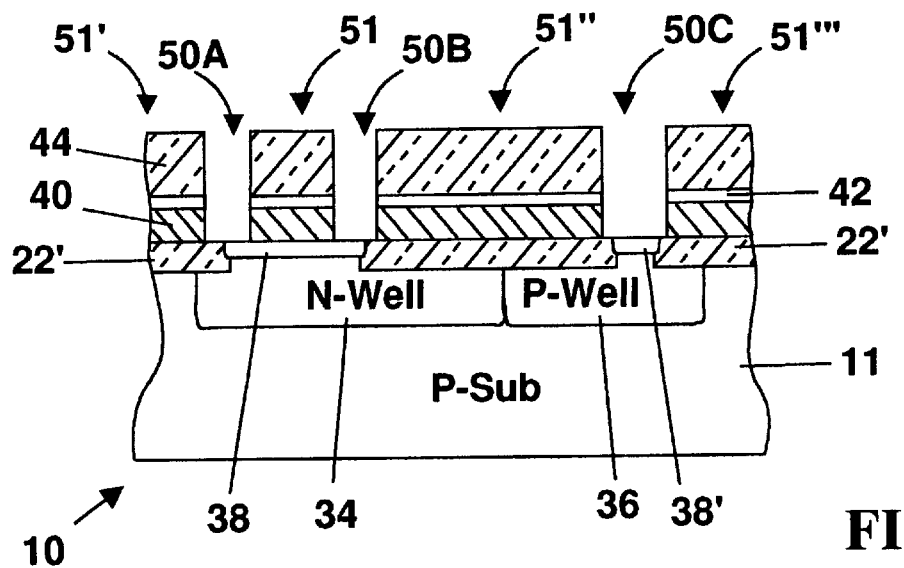
Figure 1N:
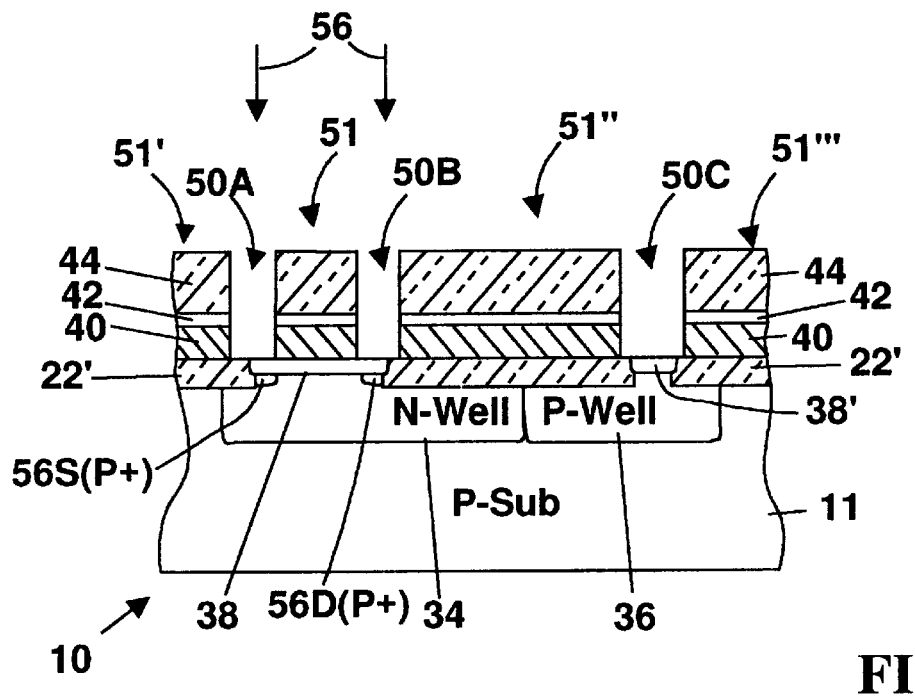
Figure 1O:
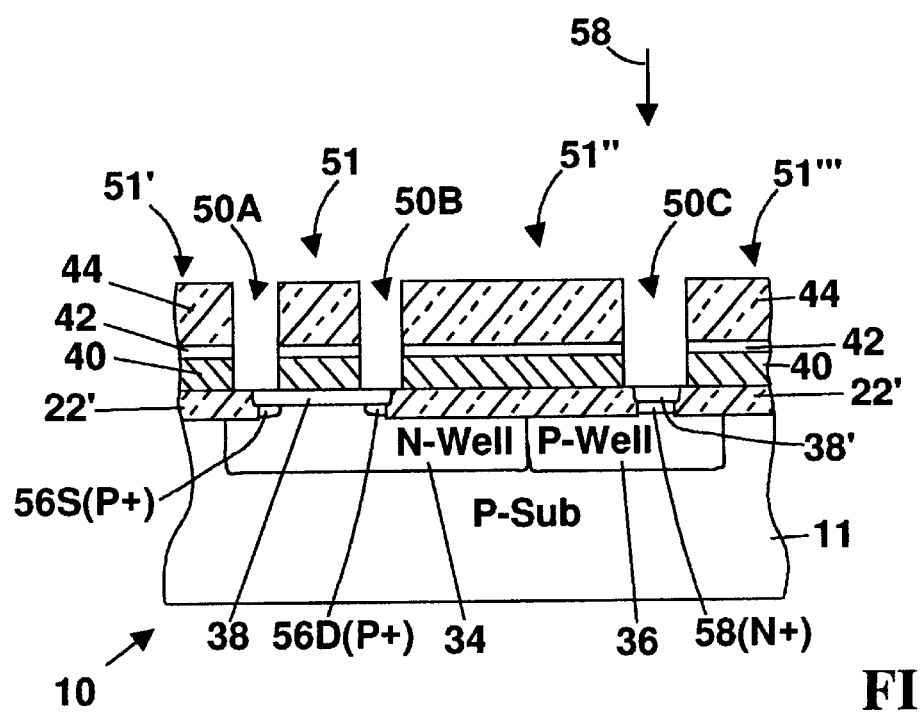
Figure 2A:
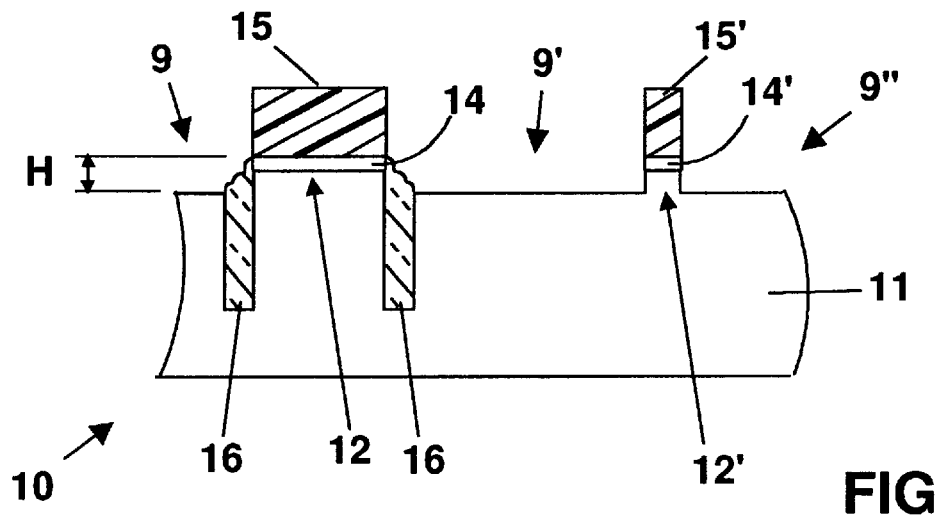
FIGS. 2A–2G illustrate a process of manufacturing a Shallow Trench Isolation (STI) device in accordance with this invention with deep trench capacitor structures.
Figure 2B:
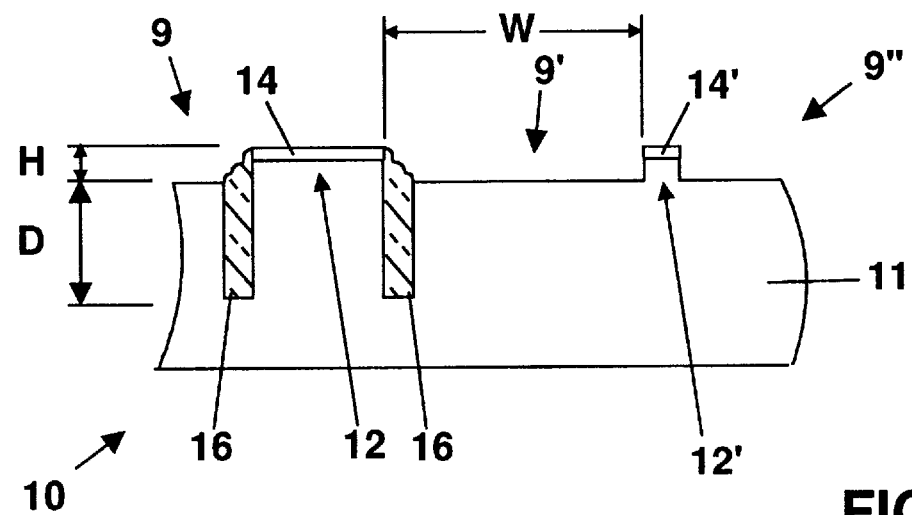
Figure 2C:
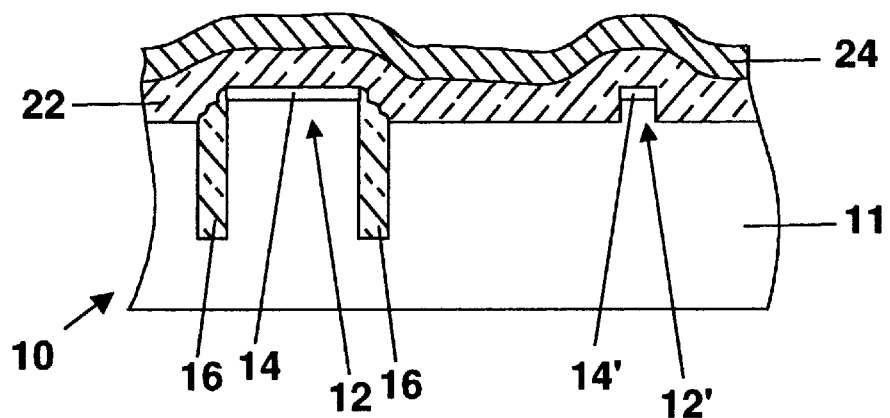
Figure 2D:
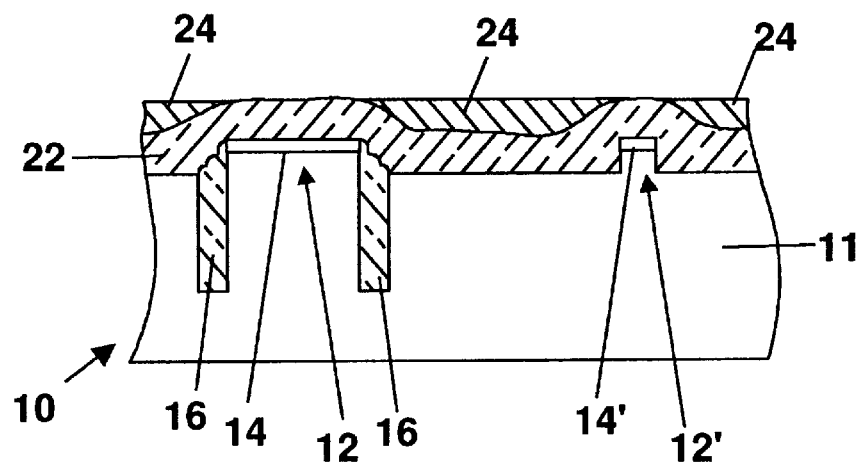
Figure 2E:
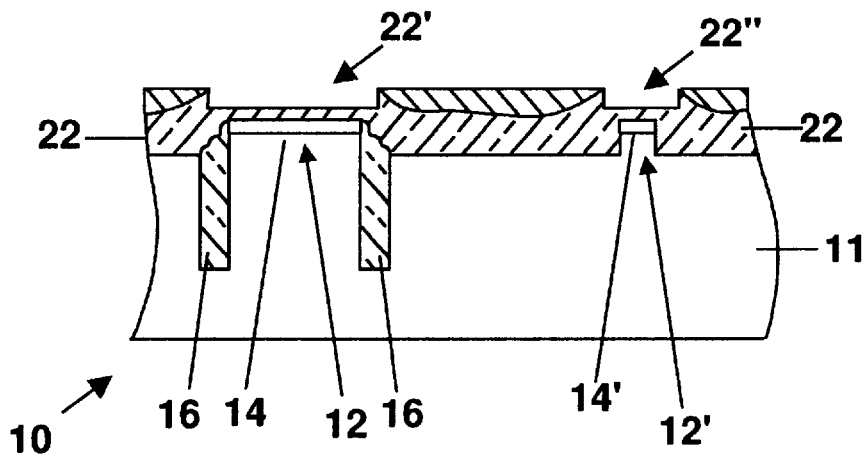
Figure 2F:
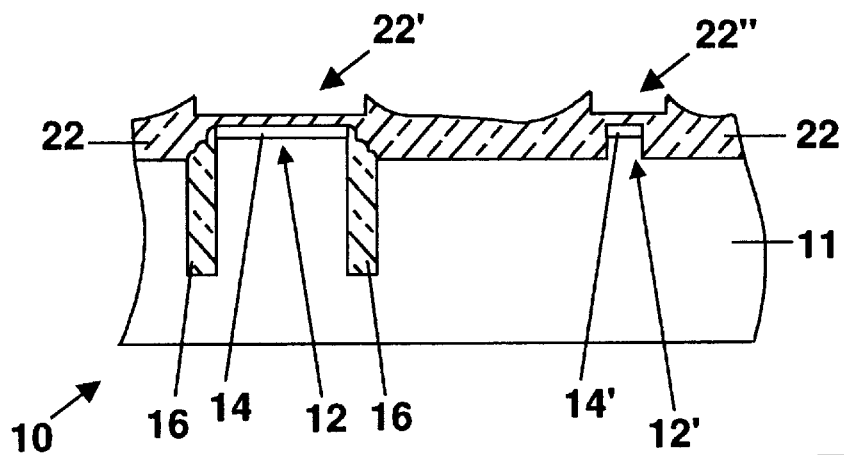
Figure 2G:
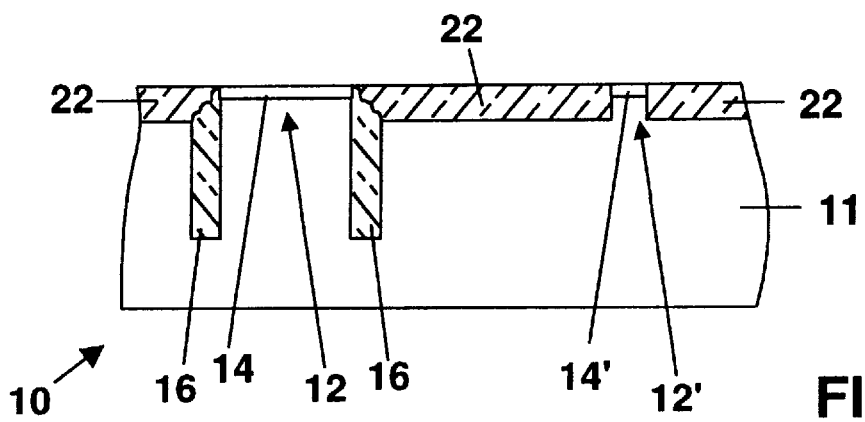

FIGS. 1A–1O illustrate a process of manufacturing a Shallow Trench Isolation (STI) device 10 in accordance with this invention.

FIG. 1A shows the device 10 in an early stage of manufacture. The device 10 is formed on a P-doped silicon substrate 11 upon which pad silicon dioxide/silicon nitride pad layer segments 14/14' have been formed. The silicon nitride in pad layer segments 14/14' is to serve as an etch stop. In the pad layers segments 14/14' the silicon dioxide layer has a thickness from about 50 Å to about 150 Å and the silicon nitride layer has a thickness from about 1,000 Å to about 1,500 Å. The active area mask 15/15' has been formed on the surface of silicon nitride layer segments 14/14' to protect the pad silicon dioxide/silicon nitride pad layer segments 14/14' and the silicon mesas 12/12' formed from the substrate 11 beneath the mask 15/15' during etching of the pad layers 14/14' into the pattern of mask 15/15', and during subsequent etching through mask 15/15' to form a set of shallow trenches 9/9'/9" in substrate 11 to a depth H below the surface of the pad layer segments 14/14'. The depth H is from about 0.35 μm to about 0.48 μm below the upper surface of the pad layer segments 14/14'.

FIG. 1B shows the device 10 of FIG. 1A after the mask 15/15' has been stripped away from the device 10, leaving the substrate 11 with the raised (mesa) active areas 12, 12' covered with structures comprising pad layer segments 14, 14'. The space between the structures comprising pad layer segments 14, 14' is a width W from about 0.25 μm to about 250 μm.

FIG. 1C shows the device 10 of FIG. 1B after deposition of a silicon dioxide layer 22 (having a thickness from about 4,800 Å to about 5,600 Å) on the device 10 covering the shallow trenches 9/9'/9" and the structures comprising pad layer segments 14/14' and the mesas 12/12'. Next the silicon dioxide layer 22 on device 10 is covered by deposition of a blanket polysilicon layer 24 on silicon oxide layer 22. Layer 24 has a thickness from about 4,000 Å to about 4,800 Å.

FIG. 1D shows the device 10 of FIG. 1C after CMP (Chemical Mechanical) Polishing of blanket polysilicon layer 24 down to those portions of silicon dioxide layer 22 which are exposed because they overlie the remaining portions of the pad layer segments 14/14' above the mesas 12/12'. Thus the only portions of silicon dioxide layer 22 which are exposed by the CMP step are those directly above the mesas 12/12' as the layer 24 remains in place aside from the mesas 12/12'.

FIG. 1E shows the device 10 of FIG. 1D after selective RIE partial etching of the exposed surface of the silicon dioxide layer 22 forming hollows 22' and 22" above the pad layer segments 14/14' above the mesas 12/12'. The etching removes a thickness from about 3,200 Å to about 4,700 Å of the silicon dioxide layer 22 over the remaining areas of pad layer 14/14'.

FIG. 1F shows the device 10 of FIG. 1E after removal of the remainder of the polysilicon layer 24 with a selective etchant which removes the polysilicon layer 24 while leaving the silicon dioxide structure 22 with hollows 22'/22" intact. In this case a thickness from about 200 Å to about 4,300 Å of polysilicon layer 24 is removed.

FIG. 1G shows the device 10 of FIG. 1F after a CMP process was used for about 50 seconds to about 70 seconds planarizing silicon dioxide layer 22 and clearing away the silicon nitride portions of pad layer segments 14/14'. Thus the CMP process leaves the surface of device 10 as a planarized surface of silicon dioxide layer 22.

FIG. 1H shows the device 10 of FIG. 1G after the silicon nitride etch stop and the silicon dioxide layers of the pad layer 14/14' have been stripped from device 10 leaving openings 24/24' (where layer 14/14' had been) in planar silicon dioxide layer 22 down to the surfaces of the mesas 12/12' exposed between the remaining portions of the silicon dioxide layer 22.

FIG. 1I shows the device 10 of FIG. 1H after "gate" sacrificial silicon dioxide gate segments 30/30' about 125 Å thick have been formed above the mesas 12/12' by the conventional process of oxidation of the exposed surface of the substrate 11. Then $V_T$ implants are made through the sacrificial silicon dioxide gate segments 30/30' into the substrate 11.

In addition, an N-well mask 31" has been formed over the device 11 with a N-well window 31'" over the sacrificial silicon dioxide gate segments 30/30' through which N type dopant ions 31' are ion implanted into the surface of substrate 11 below the gate segment 30 to form an N-well 34.

FIG. 1J shows the device 10 of FIG. 1I after N-well mask 31" has been stripped away and a P-well mask 32" has been formed over the device 11 with a P-well window 32'" over the sacrificial silicon oxide gate segment 30' through which P type dopant ions 32' are ion implanted into the surface of substrate 11 below the gate segment 30 forming a P-well region 36.

FIG. 1K shows the device 10 of FIG. 1J after the sacrificial silicon oxide gate segments 30/30' have been stripped away by etching which also thins the silicon dioxide layer 22 into thinned planar oxide larger 22' to be coplanar with the surface of device 11. Then conventional gate silicon oxide (gate oxide) layer segments 38/38' (about 100 Å thick) are formed on the surface of the mesas 12/12' within the recently enlarged openings 24/24'.

FIG. 1L shows the device 10 of FIG. 1K after the thinned planar oxide layer 22' and the gate oxide layer segments 38/38' have been coated with a doped polysilicon layer 40 preferably about 1000 Å thick, with a thickness range from about 500 Å to about 2,000 Å. Polysilicon layer 40 is coated with a silicide layer 42 preferably a tungsten silicide layer about 800 Å thick, with a thickness range from about 500 Å to about 2,000 Å. Tungsten silicide layer 42 is coated with a silicon dioxide or silicon nitride gate insulator layer 44 preferably about 2800 Å thick, with a thickness range from about 2,000 Å to about 4,000 Å.

Next, the device is coated with a photoresist gate stack mask 46 with openings 48A, 48B therethrough over the ends of gate oxide layer segment 38 over N-well 34 and opening 48C therethrough over gate oxide layer segment 38' P-well 36.

FIG. 1M shows the device 10 of FIG. 1L after the introducing the RIE etchant through openings 48A, 48B, and 48C down through gate insulator layer 44 etching openings 50A, 50B, and 50C therein extending down through tungsten silicide layer 42 and doped polysilicon layer 40 to expose the surface of the gate oxide layer segments 38/38' leaving a gate conductor stack 51 over N-well 34 with source/drain windows on either side and a dummy window 50C exposing the P-well for ion implanting subsequently, as indicated by arrows 58 in FIG. 1O which is described below.

FIG. 1N shows the device 10 FIG. 1M after ion implanting the P+ dopant source/drain regions 56S/56D below the silicon oxide segment 38 self-aligned with the gate conductor stack 51.

FIG. 1O shows the device 10 of FIG. 1N after ion implanting N+ dopant into N+ region 58 through the dummy opening 50C, as indicated by arrow 58, to form N+ region 58(N+) in P-well 36, below silicon oxide segment 38'.

By designing dummy active silicon mesas in STI regions within the gate conductor stack by filling punch-hole areas, a maskless STI (MSTI) planarization process previously can be realized on products incorporating STI and gate conductor stack Fill technologies.

FIGS. 2A–2G illustrate a process of manufacturing a Shallow Trench Isolation (STI) device 10 in accordance with this invention with deep trench capacitor structures 16. Corresponding structures in FIGS. 2A–2G are the same as those in FIGS. 1A–1G and the descriptions thereof apply to a device 10 which includes the deep trench capacitor structures 16 initially at the beginning of the process of manufacture.

FIG. 4 shows a perspective, sectional view of a portion of the device 10 in accordance with this invention with a dummy area in which the vias 54 reach down into dummy regions where no active devices have been formed. The structure is otherwise the same as the device described in FIGS. 1A–1O. The device 10 is formed on the P-doped silicon substrate 11 upon which silicon mesas 12 have been formed from the substrate 11 between the recesses therein containing the shallow trenches filled with the silicon oxide regions 22 upon which dummy gate conductor stacks of polysilicon layer 40, silicide layer 42 and the silicon dioxide or silicon nitride dielectric layer 44 have been formed. Between the dummy conductor stacks are the vias 54 (punch holes) which extend down to the top of the mesas 12.

Maskless STI Planarization Using Self-Aligned Polysilicon.

For the ideally scalable ULSI CMOS device, process control of the isolation technology is crucial. Device isolation needs to provide an abrupt active-to-isolation transition with sufficient isolation depth and to provide a planar wafer surface. This must be achieved with a wide process window at a low cost.

Several alternative planarization techniques have been proposed. For example, LOCOS is inexpensive but suffers from insulator thinning at narrow dimensions, bird's beak formation, field-implant encroachment, and creates significant wafer topography. Poly-Buffered LOCOS and Poly-encapsulated LOCOS improved the bird's beak formation but still result in a narrow channel effect that increases device Vts.

Shallow Trench Isolation (STI) provides an abrupt active-to-isolation transition without bird's beak formation with a minimum impact on device characteristics or topography. However, the process often requires extensive measurements and wafer to wafer process customization to control, i.e., a resist planarization mask used for fabrication of a 16 Mb DRAM, and has a higher cost than LOCOS based methods.

A manufacturable STI planarization process using Self-Aligned polysilicon and a planarization mask provides a stable and reliable process with a robust process window. It does not require extensive inline measurements or wafer to wafer process customization to control.

The Self-Aligned Poly-silicon planarization process can be greatly simplified by use of mesas of active silicon within the STI regions in accordance with this invention. This allows the planarization mask, CMP stop silicon oxide layer deposition, and the CMP stop silicon oxide layer etch to be completely eliminated. This is compatible with a gate conductor stack with fill technology by using a 'punch-hole' gate conductor stack mask. This allows large area STI regions to have active silicon mesas placed within the gate conductor stack-fill 'punch-hole' areas, thus creating additional polish stop areas to prevent CMP dishing in the STI regions during planarization.

Maskless STI Planarization Using Self-Aligned Polysilicon.

Process

1. Substrates start with an STI of depth "H" with maximum width W. "H" depends on device design requirements. "W" depends on planarization distance of CMP pad used for polishing sacrificial polysilicon (~30–50 ≈μm for an IC1000 CMP Pad);
2. STI shapes are designed to have active silicon mesas placed within the gate conductor stack-Fill "punch-hole" areas;
3. Deposition of silicon oxide layer to be planarized of thickness "H"+≈25% Ox; over initial pad structure (e.g. silicon nitride);
4. Deposition of polysilicon sacrificial layer of thickness ≈"H" over silicon oxide layer;
5. CMP polysilicon layer stopping on silicon oxide layer;
6. Using a combination of non-selective & selective silicon oxide/polysilicon RIE, etch the silicon oxide over the initial pad structure to be coplanar with the top of the silicon oxide in the large STI areas. The RIE will leave a thin layer of polysilicon over the STI regions;
7. Selectively strip remaining polysilicon.
8. CMP remaining silicon oxide down to initial pad structure.

Supporting Data

Cost of Ownership of STI Planarization Using Self-Aligned Poly-silicon

| SEQ | MOD | PROCESS | DESCR | TOOL | WF/HR | Tput | MASKED $ | TOOL | WF/H | Tput | MASKLESS $ |
|---|---|---|---|---|---|---|---|---|---|---|---|
| 2110 | 020 | ST | 1 | LITHO (AA IT RX) | AA | 10 | 25 | 17.63 | AA | 10 | 25 | 17.63 |
| 2111 | 020 | ST | | INSPECT LITHO | 140 | 75 | 1.34 | | 140 | 75 | 1.34 |
| 2112 | 020 | ST | | MEAS O L | 160 | 75 | 0.96 | | 160 | 75 | 0.96 |
| 2113 | 020 | ST | | MEAS LINEWIDTH | 150 | 250 | 0.58 | | 150 | 250 | 0.58 |
| 2130 | 020 | ST | | ETCH ST | 1230 | 10 | 15.21 | | 1230 | 10 | 15.21 |
| 2131 | 020 | ST | | PLASMA STRIP | 1200 | 30 | 1.84 | | 1200 | 30 | 1.84 |
| 2134 | 020 | ST | | MEAS AFM THICKNESS | 210 | 150 | 0.47 | | 210 | 150 | 0.47 |
| 2150 | 020 | ST | | CLEAN SP STRIP | 1400 | 75 | 1.46 | | 1400 | 75 | 1.46 |
| 2153 | 020 | ST | | MEAS LINEWIDTH | 150 | 250 | 0.58 | | 150 | 25 | 0.58 |
| 2170 | 020 | ST | | CLEAN SP STRIP | 1400 | 75 | 1.46 | | 1400 | 75 | 1.46 |
| 2189 | 020 | ST | | PC IT OX | 1410 | 125 | 1.40 | | 1410 | 125 | 1.40 |
| 2190 | 020 | ST | | OX ET SAC | 1180 | 20 | 4.61 | | 1180 | 20 | 4.61 |
| 2194 | 020 | ST | | MEAS THICKNESS | 200 | 300 | 0.26 | | 200 | 300 | 0.26 |
| 2100 | 020 | ST | | NITR LINER | | | | | | | |
| 2104 | 020 | ST | | MEAS THICKNESS | | | | | | | |
| 2210 | 020 | ST | | TEOS AA | 1120 | 10 | 12.95 | | 1120 | 10 | 12.95 |
| 2214 | 020 | ST | | MEAS THICKNESS | 200 | 300 | 0.26 | | 200 | 300 | 0.26 |
| 2230 | 020 | ST | | POLY PETRI NITRIDE | 1110 | 30 | 3.64 | | 1110 | 30 | 3.64 |
| 2234 | 020 | ST | | MEAS THICKNESS | 200 | 300 | 0.26 | | 200 | 300 | 0.26 |
| 2250 | 020 | ST | | DEP OX | 1300 | 20 | 11.68 | | | | |
| 2254 | 020 | ST | | MEAS THICKNESS | 200 | 300 | 0.26 | | | | |
| 2510 | 020 | ST | 1 | LITHO (AC.AB) | AC | 20 | 30 | 11.00 | | | | |
| 2511 | 020 | ST | | INSPECT LITHO | 140 | 75 | 1.34 | | | | |
| 2512 | 020 | ST | | MEAS. O L | 160 | 75 | 0.96 | | | | |
| 2513 | 020 | ST | | MEAS. LINEWIDTH | 150 | 250 | 0.58 | | | | |
| 2520 | 020 | ST | | BAKE RESIST | | | | | | | |
| 2530 | 020 | ST | | RESIST PLANARIZE | | | | | | | |
| 2531 | 020 | ST | | INSPECT RESIST | | | | | | | |
| 2537 | 020 | ST | | BAKE RESIST 2 | | | | | | | |
| 2540 | 020 | ST | | ETCH A8 | | | | | | | |
| 2544 | 020 | ST | | MEAS. THICKNESS | | | | | | | |
| 2550 | 020 | ST | | ETCH REWORK A8 | | | | | | | |
| 2551 | 020 | ST | | PLASMA STRIP | | | | | | | |
| 2552 | 020 | ST | | INSPECT STRIP | | | | | | | |
| 2554 | 020 | ST | | MEAS. THICKNESS | | | | | | | |
| 2560 | 020 | ST | | ETCH PETRI MASK OX | 1410 | 125 | 2.40 | | | | |
| 2570 | 020 | ST | | CLEAN SP STRIP - 100:1 DHP | | | | | | | |
| 2590 | 020 | ST | | CMP IT | 940 | 20 | 7.17 | | 940 | 20 | 7.17 |
| 2594 | 020 | ST | | MEAS. AFM | | | | | | | |
| 2597 | 020 | ST | | BRUSH CLN | 970 | 30 | 3.25 | | 970 | 30 | 3.25 |
| 2599 | 020 | ST | | CLEAN HALING AB | 1410 | 125 | 1.40 | | 1410 | 125 | 1.40 |
| 2610 | 020 | ST | | ETCH PETRI BULK OX | 1230 | 20 | 8.11 | | 1230 | 20 | 8.11 |
| 2620 | 020 | ST | | CLEAN 100 1 - DHP 6 KOH | | | | | | | |
| 2629 | 020 | ST | | PC ANNEAL - SP HUANG A18 | 1410 | 125 | 1.40 | | 1410 | 125 | 1.40 |
| 2630 | 020 | ST | | ANNEAL AA DENS | 1150 | 20 | 4.38 | | 1150 | 20 | 4.38 |
| 2634 | 020 | ST | | MEAS. AFM | | | | | | | |
| 2650 | 020 | ST | | CMP OX | 960 | 20 | 8.17 | | 960 | 20 | 8.17 |
| 2653 | 020 | ST | | MEAS. THICKNESS | 200 | 300 | 0.26 | | 200 | 300 | 0.26 |
| 2654 | 020 | ST | | MEAS. AFM | 210 | 150 | 0.47 | | 210 | 150 | 0.47 |

-continued

| | | | | | | | MASKED | | | MASKLESS | | |
|---|---|---|---|---|---|---|---|---|---|---|---|---|
| SEQ | MOD | PROCESS | DESCR | TOOL | | WF/HR | Tput | $ | DESCR/TOOL | WF/H | Tput | $ |
| 2657 | 020 | ST | BRUSH CLN | | | 970 | 30 | 3.25 | | 970 | 30 | 3.25 |
| 2658 | 020 | ST | INSPECT CMP | | | 140 | 75 | 1.34 | | 140 | 75 | 1.34 |
| 2659 | 020 | ST | CLEAN HAUNG AB | | | 1410 | 125 | 1.40 | | 1410 | 125 | 1.40 |
| 2729 | 020 | ST | P C IT DENS ANNEAL | | | | | | | | | |
| 2730 | 020 | ST | ANNEAL IT DENS | | | | | | | | | |
| 2740 | 020 | ST | STRIP NITRIDE | | | 1410 | 36 | 3.45 | | 1410 | 36 | 3.45 |
| 2741 | 020 | ST | INSP. STRIP | | | 140 | 75 | 1.34 | | 140 | 75 | 1.34 |
| 2748 | 020 | ST | CLEAN | | | | | | | | | |
| 2749 | 020 | ST | P C 100 DHF - HUANG A 8 | | | 1420 | 66 | 1.94 | | 1420 | 66 | 1.94 |
| 2750 | 020 | ST | OX TG SAC | | | 1180 | 20 | 4.61 | | 1180 | 20 | 4.61 |
| 2754 | 020 | ST | MEAS. THICKNESS | | | 200 | 300 | 0.26 | | 200 | 300 | 0.26 |
| TOTAL W/O KV | | | | | | | | $144.53 | | | | $117.32 |

The cost has been calculated to decrease from about $145 to about $117 for the STI planarization module using MSTI.

Operations Summary

Much development effort was invested in creating a manufacturable STI planarization process using self-aligned polysilicon for this process. Data was collected and analyzed from hundreds of integrated product lots showing that the method of this invention for STI planarization creates a stable process with a large process window.

Simplifying the self-aligned polysilicon STI planarization process by eliminating a planarization mask allows the polysilicon CMP stop silicon oxide layer and polysilicon CMP stop silicon oxide etch processes to be eliminated also.

By designing active silicon mesas within large STI regions (within the gate conductor stack-Fill punch-hole areas in a gate conductor stack-Fill technology) and limiting the largest STI width to the planarization distance of CMP pad used for polishing the sacrificial polysilicon (~30–50 ≈$\mu$m for an IC1000 CMP pad), MSTI can be easily implemented.

There is a gate conductor (GC) stack with fill over trenches, and the fill is etched to produce vias for vertical contacts to diffusion areas on active sites.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new desirable to be secured by Letters Patent is as follows:

1. A method of manufacturing a semiconductor FET device employing a Shallow Trench Isolation (STI) method comprising the steps as follows:

a) provide a doped silicon semiconductor substrate coated with a plurality of patterned pad layer structures on the surface of said substrate, and provide a patterned masking layer formed on said pad layer, which includes patterns for device mesas and dummy mesas, b) form a raised active silicon device mesa and form a dummy active silicon mesa, with said mesas having top surfaces capped with said pad layer structures, said mesas being formed with said patterns from said doped silicon semiconductor substrate, and said pad layer structures, said pad layer being below said patterned masking layer, then strip said masking layer leaving said pad layer structures on said substrate, c) deposit a conformal blanket silicon oxide layer covering said doped silicon semiconductor substrate and said raised active silicon device areas and said dummy active silicon mesas with said mesas remaining capped with pad structures with conformal projections of said blanket silicon oxide layer above said mesas, d) deposit a conformal blanket sacrificial layer on said blanket silicon oxide layer with additional conformal projections of said sacrificial layer above said mesas, e) initially planarize said blanket sacrificial layer to remove said additional conformal projections until said silicon oxide layer is exposed only over said pad structures, f) selectively RIE etch said blanket conformal silicon oxide layer partially, over said mesas, g) selectively etch away the remainder of said sacrificial layer, h) perform later planarizing of said conformal blanket silicon oxide layer, leaving said conformal blanket silicon oxide layer at a level above said top surface of said mesas and then remove said pad structures forming openings in said conformal blanket silicon dioxide layer, exposing top surfaces of said active silicon device mesas and top surfaces of said dummy active silicon mesas below said openings, i) next form a conventional gate oxide layer on said surface of said device mesas and said dummy mesas, k) form a gate conductor stack for said FET device with source/drain openings therethrough self-aligned with said gate conductor stack over said active silicon device mesas, and l) then form an FET device and a dummy doped region in said dummy active silicon device mesa by implantation of a dose of source/drain dopant ions into said active device areas and said dummy areas in said semiconductor substrate.

2. A method in accordance with claim 1 wherein: said pad structures are composed of a silicon nitride etch stop layer having a thickness from about 1,000 Å to about 1,500 Å over a layer of silicon oxide with a thickness from about 50 Å to about 150 Å.

3. A method in accordance with claim 1 wherein: said pad structures are composed of a lower layer of silicon oxide capped with an upper layer of silicon nitride comprising an etch stop layer.

4. A method in accordance with claim 1 wherein:

said later planarizing is performed by chemical mechanical polishing, then, after said later planarizing is performed by said chemical mechanical polishing, stripping away said pad structures from said device, followed by forming gate oxide layers above the surfaces of said substrate exposed by stripping away said pad structures.

5. A method in accordance with claim 1 wherein:

said later planarizing is performed by later chemical mechanical polishing, after said later planarizing step is performed by said later chemical mechanical polishing then stripping away said pad structures from said device, next forming gate oxide layers above the surfaces of said substrate exposed by stripping away said pad structures, and after formation of said gate oxide layer, forming P-wells and N-wells in said substrate beneath said gate oxide layer and said silicon oxide layer.

6. A method in accordance with claim 1 wherein:

said later planarizing is performed by later chemical mechanical polishing, after performance of said later planarizing by said later chemical mechanical polishing then stripping away said pad structures from said device, followed by forming gate oxide layers above the surfaces of said substrate exposed by stripping away said pad structures, and after said gate oxide layer, forming P-wells and N-wells in said substrate beneath said gate oxide layer and said silicon oxide layer, following formation of said wells by performing the step of blanket deposition of a gate conductor layer upon said device, then performing a blanket deposition of a dielectric layer, then patterning and etching of windows down to active device areas and dummy areas in said substrate, followed by formation of FET devices and dummy devices by ion implantation of a dose of source/drain dopant ions into said active device areas and said dummy areas in said P-wells and said N-wells.

7. A method in accordance with claim 1 wherein:

said later planarizing is performed by later chemical mechanical polishing, after said later planarizing by said later chemical mechanical polishing then performing the step of stripping away said pad structures from said device, then forming said gate oxide layer above the surfaces of said substrate exposed by stripping away said pad structures, and after formation of said gate oxide layer, P-wells and N-wells are formed in said substrate beneath said gate oxide layer and said silicon oxide layer, after formation of said wells perform a step of blanket deposition of a gate conductor layer composed of a polysilicon sublayer and a silicide sublayer upon said device, follow with a blanket deposition of a dielectric layer, then pattern and etch windows down to active device areas and dummy areas in said substrate, then form FET devices and dummy devices by ion implantation of a dose of source/drain dopant ions into said active device areas and said dummy areas in said P-wells and said N-wells.

8. A method of manufacturing a semiconductor FET device employing a Shallow Trench Isolation (STI) method comprising the steps performed in the sequence as follows:

a) provide a doped silicon semiconductor substrate coated with pad structures on the surface thereof, said pad structures each comprising stacks including a silicon nitride etch stop layer and a silicon dioxide layer, b) form a mask over said silicon dioxide layer and etch trenches in said substrate, and said pad structures with a pattern forming raised active silicon device mesas and forming dummy active silicon mesas capped with pad structures from said doped silicon semiconductor substrate and said pad structure with said pad structures below said mask, c) remove said mask, thus uncovering said pad structures, and deposit a blanket conformal silicon oxide layer on said device including said pad structures on said mesas, d) deposit a conformal blanket polysilicon layer on said blanket silicon oxide layer with additional conformal projections above said mesas, e) perform chemical mechanical polishing of said blanket polysilicon layer to remove said additional conformal projections until said silicon oxide layer is exposed over said pad structures, f) perform selective RIE partial etching of said conformal silicon oxide layer over said mesas, and g) perform later chemical mechanical polishing of said conformal blanket silicon oxide layer leaving said conformal blanket silicon oxide layer projecting above said top surface of said mesas while using said silicon nitride layer as an etch stop thereby converting said silicon oxide layer into a planar silicon oxide layer, h) then stripping said pad structures including said silicon nitride stop layer and said silicon dioxide layer, thereby forming openings in said conformal blanket silicon dioxide layer exposing top surfaces of said active silicon device mesas and top surfaces of said dummy active silicon mesas below said openings, i) next form a conventional gate oxide layer on said surface of said device mesas and said dummy mesas and then form a gate conductor stack for said FET device with source/drain openings therethrough self-aligned with said gate conductor stack over said raised active silicon device areas and form a dummy window over one of said dummy active silicon mesas, and j) form source/drain regions in one of said raised active silicon device areas and form a dummy doped region in said one of said dummy active silicon mesas.

9. A method in accordance with claim 8 wherein said pad structures are composed of silicon nitride.

10. A method in accordance with claim 8 wherein said pad structures are composed of a lower layer of silicon oxide capped with an upper layer of silicon nitride.

11. A method in accordance with claim 8 wherein:

after said later chemical mechanical polishing step performing the step of stripping away said pad structures from said device, then form gate oxide layers above the surfaces of said substrate exposed by said stripping away.

12. (Twice Amended) A method in accordance with claim 8 wherein:
  after said later chemical mechanical polishing stripping away said pad structures from said device, then forming gate oxide layers above the surfaces of said substrate exposed by said stripping away,
  after formation of said gate oxide layer, P-wells and N-wells are formed in said substrate beneath said gate oxide layer and said silicon oxide layer.

13. A method in accordance with claim 2 wherein:
  after said later chemical mechanical polishing stripping away said pad structures from said device, then forming gate oxide layers above the surfaces of said substrate exposed by said stripping away,
  after formation of said gate oxide layer, then P-wells and N-wells are formed in said substrate beneath said gate oxide layer and said silicon oxide layer,
  following formation of said wells there is a step of blanket deposition of a gate conductor layer upon said device followed by blanket deposition of a dielectric layer,
  that step is followed by patterning and etching of windows down to active device areas and dummy areas in said substrate, and
  that step is followed by formation of FET devices and dummy devices by ion implantation of a dose of source/drain dopant ions into said active device areas and said dummy areas in said P-wells and said N-wells.

14. A method in accordance with claim 8 wherein:
  after said later chemical mechanical polishing, then stripping away said pad structures from said device, then forming gate oxide layers above the surfaces of said substrate exposed by said stripping away,
  after formation of said gate oxide layer, P-wells and N-wells are formed in said substrate beneath said gate oxide layer and said silicon oxide layer,
  after formation of said wells there is a step of blanket deposition of a gate conductor layer composed of a polysilicon sublayer and a suicide sublayer upon said device;
  then blanket deposition of a dielectric layer;
  then patterning and etching of windows down to active device areas and dummy areas in said substrate,
  followed by formation of FET devices and dummy devices by ion implantation of a dose of source/drain dopant ions into said active device areas and into said dummy areas in said P-wells and said N-wells.

15. A method of manufacturing a semiconductor FET device employing a Shallow Trench Isolation (STI) method comprising the steps as follows:
  a) provide a doped silicon semiconductor substrate, said substrate having a surface coated with a plurality of patterned pad structures formed layers of upper and lower layer materials, coated in turn with a mask,
  b) form a raised active silicon device mesa and form a dummy active silicon mesa, said mesas having top surfaces capped with said pad structures, and said mesas being formed from said doped silicon semiconductor substrate by etching STI trenches in said substrate patterned by said mask followed by stripping said mask leaving said mesas between said STI trenches covered with said pad structures,
  c) deposit a conformal blanket silicon oxide layer covering said doped silicon semiconductor substrate and said raised active silicon device areas and said dummy active silicon mesas capped with pad structures with conformal projections above said mesas,
  d) deposit a conformal blanket sacrificial layer on said blanket silicon oxide layer with additional conformal projections of said sacrificial layer above said mesas,
  e) planarize said blanket sacrificial layer to remove said additional conformal projections of said sacrificial layer until said silicon oxide layer is exposed only over said pad structures,
  f) selectively RIE etch said blanket conformal silicon oxide layer partially, over said mesas,
  g) selectively etch away said sacrificial layer,
  h) perform additional planarizing of said conformal blanket silicon oxide layer and said structures but removing only said upper layer material from said surfaces of said pad structures so said pad structures have a thickness thereof remaining and said conformal blanket silicon oxide layer projects above said top surface of said mesas,
  i) strip the remainder of said pad structures leaving openings in said conformal blanket silicon dioxide exposing portions of said surface of said substrate therebelow including surfaces of said active silicon device mesas and surfaces of said dummy active silicon mesas below said openings,
  j) form sacrificial gate segments composed of silicon dioxide on said portions of said surface of said substrate above said mesas in place of said remainder of said pad structures by oxidation of said surface of said substrate,
  k) performing $V_T$ implants through said gate segments,
  l) then form a P-well and an N-well in said substrate beneath said gate oxide layer and beneath portions of said silicon oxide layer,
  m) then strip said sacrificial gate segments from said surface of said substrate above said mesas,
  n) form conventional gate oxide layer on said surface of said substrate above said mesas, and
  o) form a gate conductor stack over said N-well and form source/drain regions self-aligned with said gate conductor stack in said N-well and form a dummy window over said P-well, and
  p) form a dummy doped region in said P-well below said dummy window and form source/drain regions in said raised active silicon device mesas.

16. A method of manufacturing a semiconductor FET device employing a Shallow Trench Isolation (STI) method comprising the steps as follows:
  a) provide a doped silicon semiconductor substrate, said substrate having a surface coated with a plurality of patterned pad structures formed of layers including a silicon oxide lower layer capped with a silicon nitride upper layer, said pad structures being coated in turn with a mask,
  b) form raised active silicon device mesas and form dummy active silicon mesas capped with said pad structures from said doped silicon semiconductor substrate and said pad structures patterned by etching mask followed by stripping said mask,
  c) deposit a conformal blanket silicon oxide layer covering said doped silicon semiconductor substrate and said raised active silicon device areas and said dummy active silicon mesas capped with pad structures with conformal projections above said mesas, d) deposit a conformal blanket sacrificial layer on said blanket silicon oxide layer with additional conformal projections of said sacrificial layer above said mesas, e) perform initial planarizing of said blanket sacrificial layer to remove said additional conformal projections of said sacrificial layer until said silicon oxide layer is exposed only over said pad structures above said mesas, f) selectively RIE etch said blanket conformal silicon oxide layer partially, over said pad structures above said mesas, g) selectively etch away the remainder of said sacrificial layer, h) perform additional planarizing of said conformal blanket silicon oxide layer and said structures removing said silicon nitride lower layer of said pad structures, i) strip the remainder of said pad structures leaving openings in said conformal blanket silicon dioxide exposing portions of said surface of said substrate therebelow, exposing surfaces of said active silicon device mesas and surfaces of said dummy active silicon mesas below said openings, j) form sacrificial gate segments composed of silicon dioxide on said surfaces of said active silicon device mesas and surfaces of said dummy active silicon mesas, k) then form a first well with a first type of dopant in said substrate and form a second well with an opposite type of dopant in said substrate beneath said sacrificial gate segments and beneath portions of said silicon oxide layer, m) then strip said sacrificial gate segments from said surface of said substrate above said mesas, n) form a conventional gate oxide layer on said surface of said substrate above said mesas, and o) form a gate conductor stack with source/drain openings therethrough self-aligned with said gate conductor stack over said first wells and a dummy window over said second well, p) form a dummy doped region in another of said wells and form source/drain regions in said raised active silicon device mesas.

* * * * *